(12) United States Patent
Suzuki et al.

(10) Patent No.: US 9,105,994 B2
(45) Date of Patent: Aug. 11, 2015

(54) CONTACT PROBE AND SEMICONDUCTOR DEVICE SOCKET INCLUDING CONTACT PROBE

(75) Inventors: Katsumi Suzuki, Tokyo (JP); Takeyuki Suzuki, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 840 days.

(21) Appl. No.: 13/231,016

(22) Filed: Sep. 13, 2011

(65) Prior Publication Data

US 2012/0249174 A1  Oct. 4, 2012

(30) Foreign Application Priority Data

Mar. 29, 2011 (JP) ................. P2011-073345

(51) Int. Cl.
*G01R 1/067* (2006.01)
*H01R 13/24* (2006.01)
*H01R 11/18* (2006.01)
*G01R 1/04* (2006.01)

(52) U.S. Cl.
CPC .............. *H01R 11/18* (2013.01); *G01R 1/0483* (2013.01); *G01R 1/06722* (2013.01); *G01R 1/06738* (2013.01); *H01R 13/2421* (2013.01); *H01R 13/2485* (2013.01)

(58) Field of Classification Search
None
See application file for complete search history.

(56) References Cited

U.S. PATENT DOCUMENTS 6,377,059 B2 * 4/2002 Vinther et al. ........... 324/755.05
7,381,062 B2   6/2008 Shimada

FOREIGN PATENT DOCUMENTS

| JP | 2003-167001 A | 6/2003 |
| JP | 2004-61180 A | 2/2004 |
| JP | 2004-69508 A | 3/2004 |
| JP | 2004-152495 A | 5/2004 |
| JP | 2004-171840 A | 6/2004 |
| JP | 4021275 B2 | 12/2007 |
| JP | 2008-39456 A | 2/2008 |
| JP | 2008-39496 A | 2/2008 |
| JP | 2009-52913 A | 3/2009 |

(Continued)

OTHER PUBLICATIONS

Machine English translation of Japanese Patent Application Publication to Inventors Kodama, T et al., JP 2004-061180 A, Feb. 26, 2004. Translation of pp. 2-8 created on Apr. 10, 2014.*

(Continued)

*Primary Examiner* — Melissa Koval
*Assistant Examiner* — Stephen G Armstrong
(74) *Attorney, Agent, or Firm* — Studebaker & Brackett PC

(57) ABSTRACT

A contact probe having a plunger; a top contacting member which is provided at a tip end of the plunger and is brought into contact with an electrode of a semiconductor device; a bottom contacting member which is brought into contact with an electrode of a testing board; and an elastic member for urging the top contacting member and the bottom contacting member in opposite directions away from each other. The plunger is formed into a cylindrical shape and includes a through-hole which penetrates through the plunger in an axial direction thereof. The top contacting member includes a plurality of mountain-shaped sharp portions at a tip end thereof, and each of the sharp portions is asymmetrical with respect to a straight line that passes through a peak of the sharp portion and extends along an axial direction of the plunger, and is bent toward a center line of the plunger.

9 Claims, 17 Drawing Sheets

(56) References Cited

FOREIGN PATENT DOCUMENTS

| JP | 2009-180549 A | 8/2009 |
| JP | 2010-127901 A | 6/2010 |

OTHER PUBLICATIONS

Machine English translation of Japanese Patent Application Publication to Inventors Ichimura, Y. and Saito, M., JP 2009-052913 A, Mar. 12, 2009. Translation of pp. 2-17 created on Apr. 10, 2014.*

Japanese Office Action "Notification of Reasons for Refusal" dated May 8, 2012; Japanese Patent Application No. 2011-073345 with translation.

"Notice on the First Office Action" issued by the Patent Office of the People's Republic of China on Jan. 30, 2014, which corresponds to Chinese Patent Application No. 201210088742.5 and is related to U.S. Appl. No. 13/231,016; with English language translation.

Japanese Office Action "Notification of Reasons for Refusal" with mailing date of Dec. 6, 2011; Japanese Patent Application No. 2011-073345 with translation.

* cited by examiner

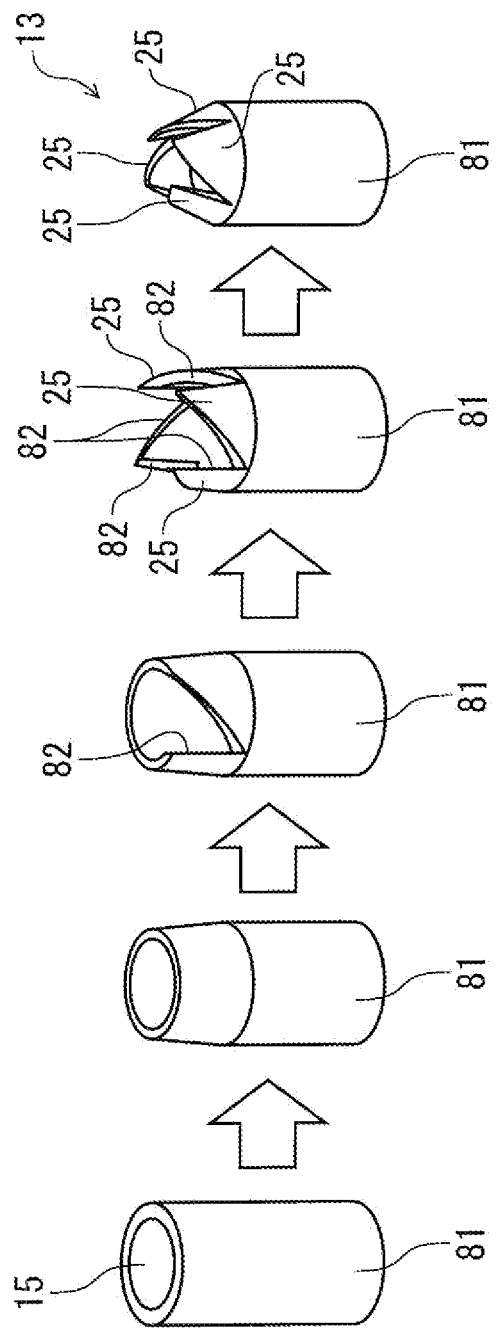

FIG. 12A
FIG. 12B
FIG. 12C
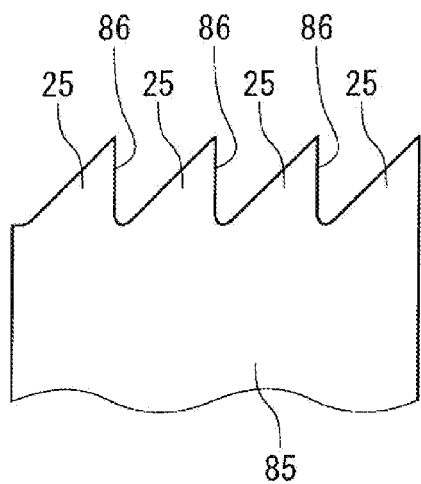
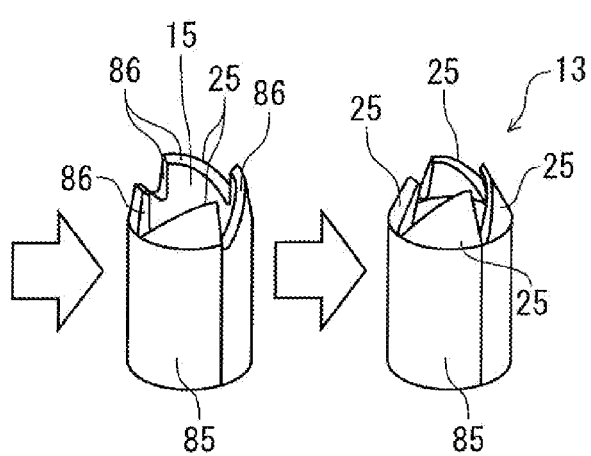

FIG. 13A
FIG. 13B
FIG. 13C
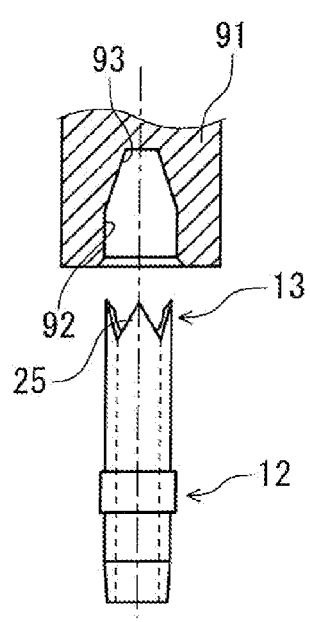
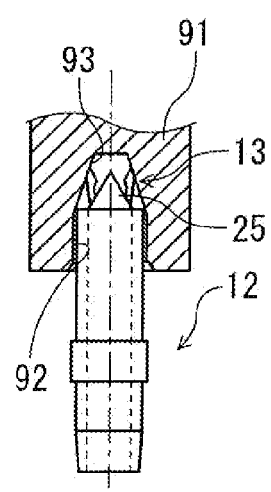
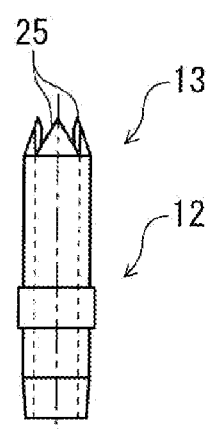

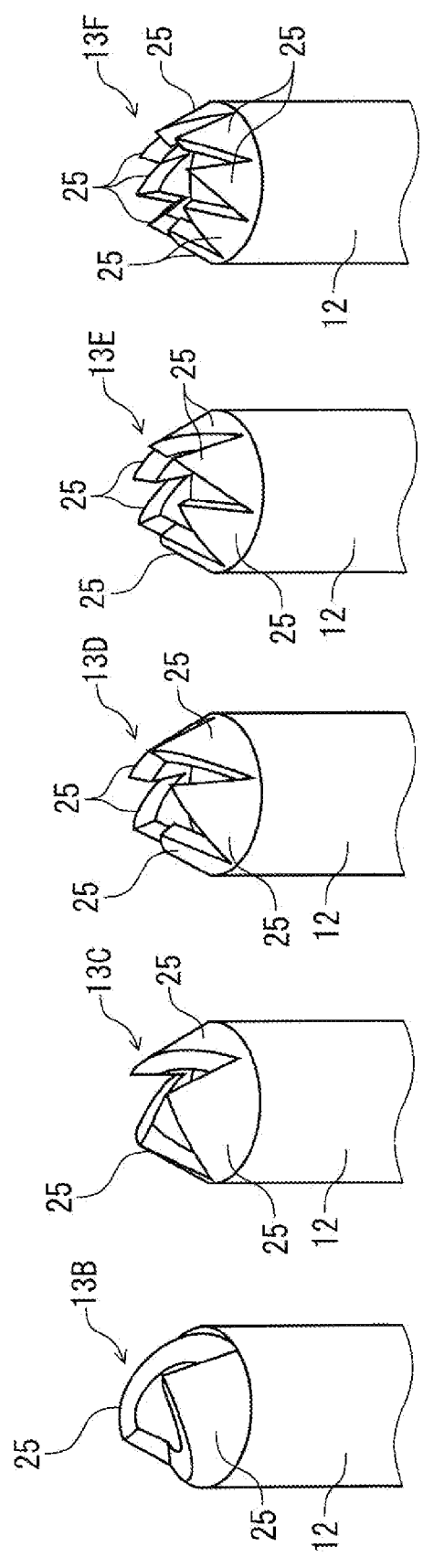

US 9,105,994 B2

CONTACT PROBE AND SEMICONDUCTOR DEVICE SOCKET INCLUDING CONTACT PROBE

This application claims priority from Japanese Patent Application No. 2011-073345, filed on Mar. 29, 2011, the entire contents of which are hereby incorporated by reference.

FIELD OF THE INVENTION

The present disclosure relates to a contact probe and a semiconductor device socket including the contact probe.

DESCRIPTION OF RELATED ART

A semiconductor device socket is provided with a contact probe as a connector for electrically connecting a semiconductor device such as an integrated circuit (IC) package having solder balls or solder bumps as electrodes to a testing circuit board of a testing instrument. The contact probe provided in such a semiconductor device socket includes: a plunger for contacting a solder ball of an IC package; and a coil spring for exerting, on the plunger, elastic urging force for bringing the contact probe in contact with the solder ball at given pressure (refer to Japanese Patent Application Publication No. JP-A-2004-152495 and Japanese Patent Application Publication No. JP-A-2003-167001, for example).

In order to establish a good electrical connection between an electrode and a contact probe, it is necessary to remove an oxide coating formed on a surface of the electrode. Therefore, the contact probe is provided with a contacting member having plural sharp contact portions. The contacting member is provided at the tip of a plate-like plunger (refer to JP-A-2004-152495) or a cylindrical plunger (refer to JP-A-2003-167001) having a given shape which is produced by punching (pressing) sheet metal. The contacting member of the plunger is brought into point contact with and sticks into an electrode by elastic urging force of the coil spring, whereby the oxide coating of the electrode is broken and good contact is obtained.

An electrode of a semiconductor device is in various forms such as a bump formed of a substantially spherical solder ball or a flat-plate-like pad. In particular, the substantially spherical solder ball as a bump is not necessarily a complete sphere and varies in position and size. As a result, it is rare that the plural contact portions of a contacting member of a plunger contact the solder ball uniformly; the manner of contact tends to vary to render the contact unstable. Furthermore, the surface of the solder is not only covered with an oxide coating but also foreign substances may be stuck to the surface. In order to bring a contacting member in stable contact with an active solder, it is necessary to cause the contacting member to bury into an electrode by applying strong pressure to the contacting member. However, this may damage the electrode.

When the sharp contacting member of the plunger is caused to bury into the solder ball of the electrode by contact pressure, solder or foreign substances may be transferred from the electrode to the contacting member of the plunger. In this case, it is difficult to remove such a solder or foreign substances stuck to the contacting member. In particular, when contacting operations are performed repeatedly, oxide coatings may also be formed on the surfaces of solder fragments transferred to the contacting member of the plunger. Such oxide coatings may increase the contact resistance, making it impossible to maintain a good electrical connection.

SUMMARY OF INVENTION

Illustrative aspects of the present invention provide a contact probe which makes it possible to test a semiconductor device smoothly and properly by bringing a contacting member into stable contact with an electrode of the semiconductor device by suppressing the increase of the contact resistance between the electrode and the contacting member, as well as also providing to a semiconductor device socket including the contact probe.

According to a first aspect of the invention, a contact probe includes: a plunger; a top contacting member which is provided at a tip end of the plunger and is brought into contact with an electrode of a semiconductor device; a bottom contacting member which is brought into contact with an electrode of a testing board; and an elastic member for urging the top contacting member and the bottom contacting member in opposite directions away from each other, wherein the plunger is formed into a cylindrical shape and includes a through-hole which penetrates through the plunger in an axial direction thereof, wherein the top contacting member includes a plurality of mountain-shaped sharp portions which are formed at the tip end of the plunger, and wherein each of the sharp portions is asymmetrical with respect to a straight line that passes through a peak of the sharp portion and extends along an axial direction of the plunger, and is bent toward a center line of the plunger.

Other aspects and advantages of the invention will be apparent from the following description, the drawings and the claims.

BRIEF DESCRIPTION OF THE DRAWINGS

FIGS. 11A to 11E are perspective views showing a manufacturing process of the plunger by cutting.

FIGS. 12A to 12C are views showing a manufacturing process of the plunger by press working in which FIG. 12A is a plan view of a metal sheet and FIGS. 12B and 12C are perspective views of the plunger.

FIGS. 13A to 13C are side views showing how the top contacting member of the plunger is formed.

FIGS. 15A and 15B are views showing a manufacturing process of a plunger of a contact probe according to another exemplary embodiment of the present invention in which FIG. 15A is a plan view of a metal sheet and FIG. 15B is a perspective view of a manufactured plunger.

FIGS. 17A to 17E are perspective views showing plungers of contact probes according to further exemplary embodiments of the present invention, respectively.

DETAILED DESCRIPTION OF EXEMPLARY EMBODIMENTS

Figure 1:
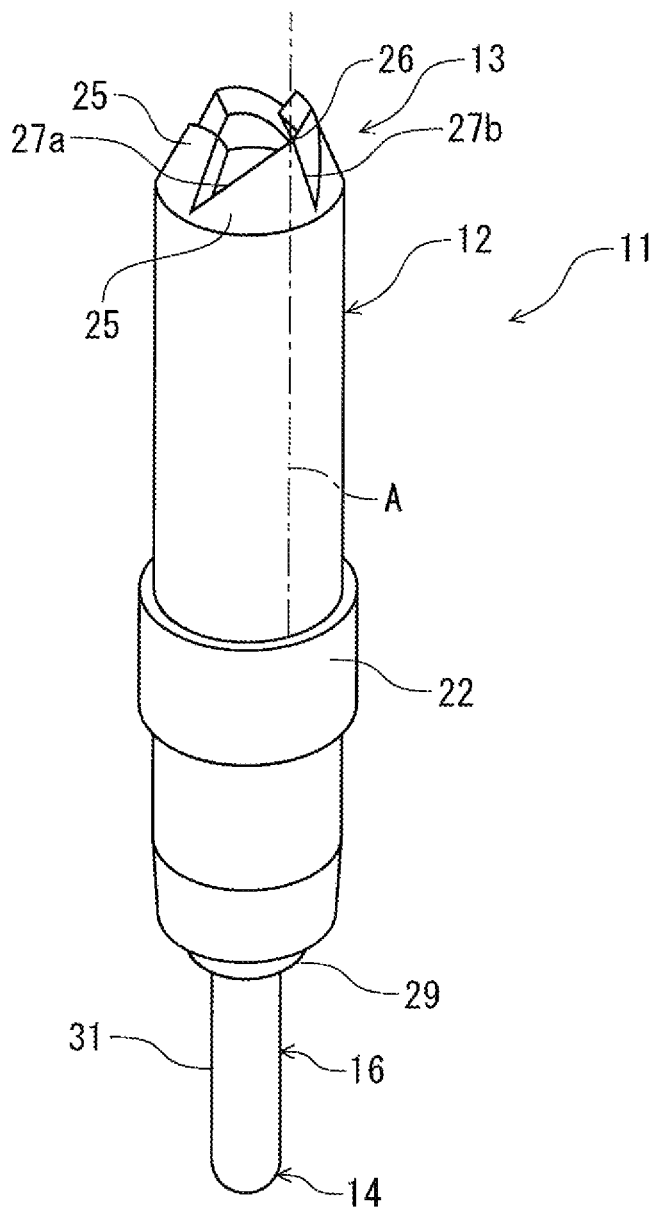
FIG. 1 is a perspective view showing a contact probe according to a first exemplary embodiment of the present invention.

A contact probe and a semiconductor device socket including the contact probe according to a first exemplary embodiment of the present invention will hereinafter be described with reference to the drawings. As shown in FIG. 1, the contact probe 11 according to the first exemplary embodiment is provided with a plunger 12 which is made of a conductive metal material. The plunger 12 has a top contacting member 13 at its tip, which is the top of the plunger 12. The contact probe 11 has a bottom contacting member 14 at the bottom thereof.

Figure 2:
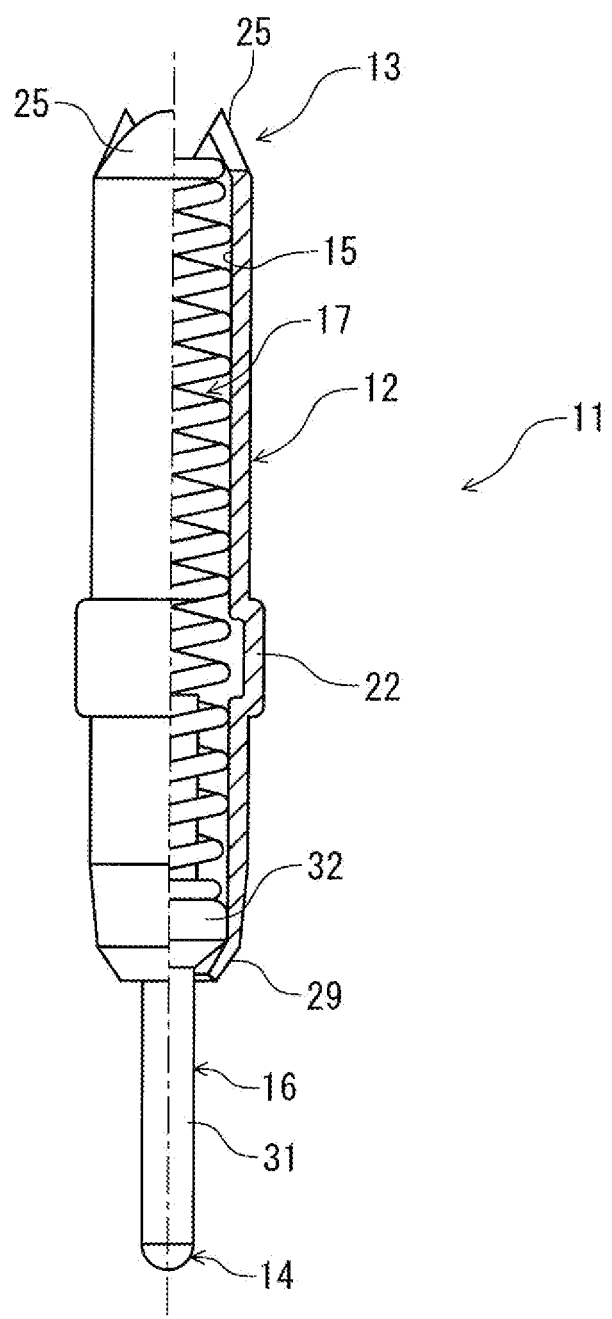
FIG. 2 is a side view in which a half part of the contact probe of FIG. 1 is shown in cross-section.
Figure 3:
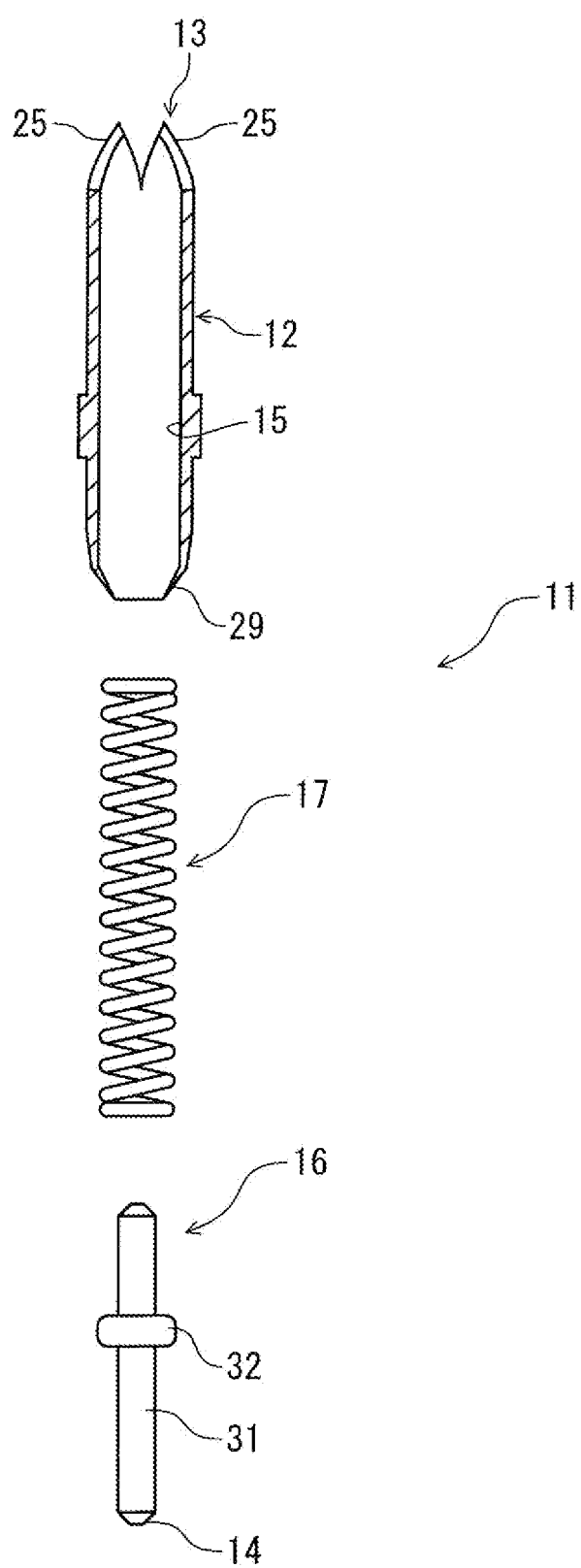
FIG. 3 is an exploded view showing the contact probe shown in FIG. 1.

As shown in FIGS. 2 and 3, the plunger 12 is a cylinder having a through-hole 15, which extends in an axial direction thereof. A sub-plunger 16 is provided under the plunger 12. The sub-plunger 16 is made of a conductive metal material and the bottom end portion of the sub-plunger 16 is formed as the bottom contacting member 14.

In the contact probe 11, a coil spring (elastic member) 17 whose outer diameter is slightly smaller than a diameter of the through-hole 15 of the plunger 12 is housed in the through-hole 15. The coil spring 17 is made of spring steel, and produces an elastic force that urges the sub-plunger 16 downward against the bottom end portion the plunger 12. As a result, the top contacting member 13 of the plunger 12 and the bottom contacting member 14 of the sub-plunger 16 are urged by the coil spring 17 in opposite directions away from each other.

Figure 4A:
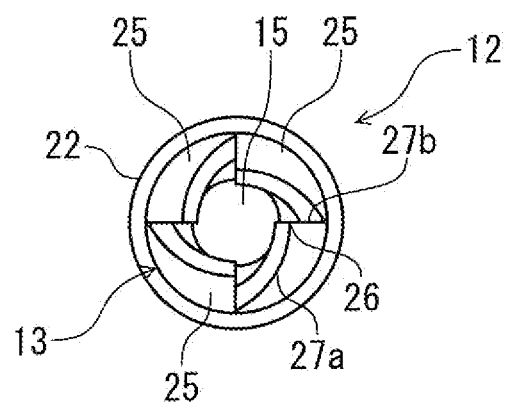
FIGS. 4A and 4B are a plan view and a side view, respectively, of a plunger which constitutes the contact probe shown in FIG. 1.
Figure 4B:
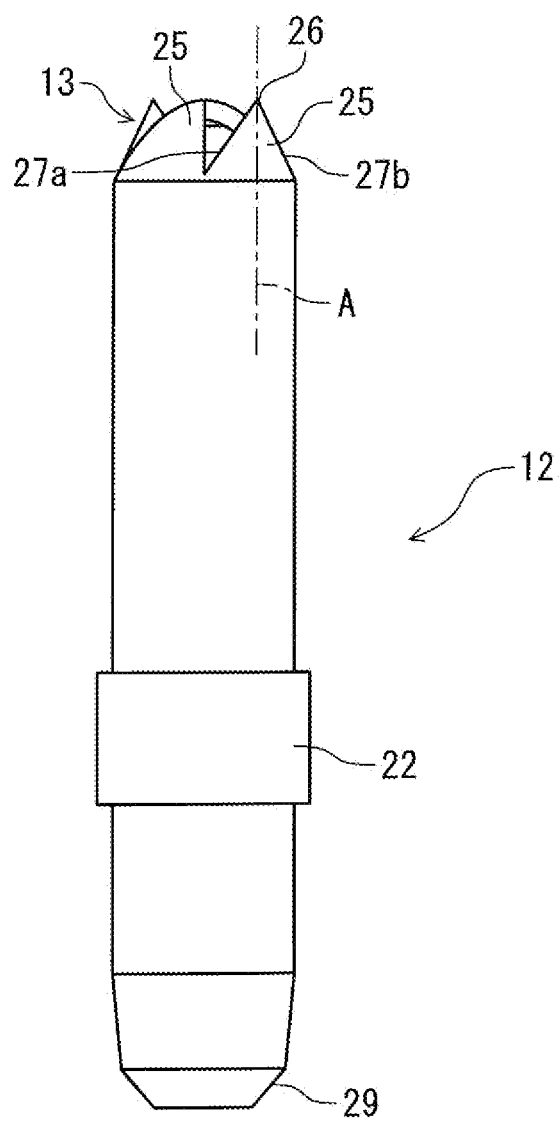
Figure 5:
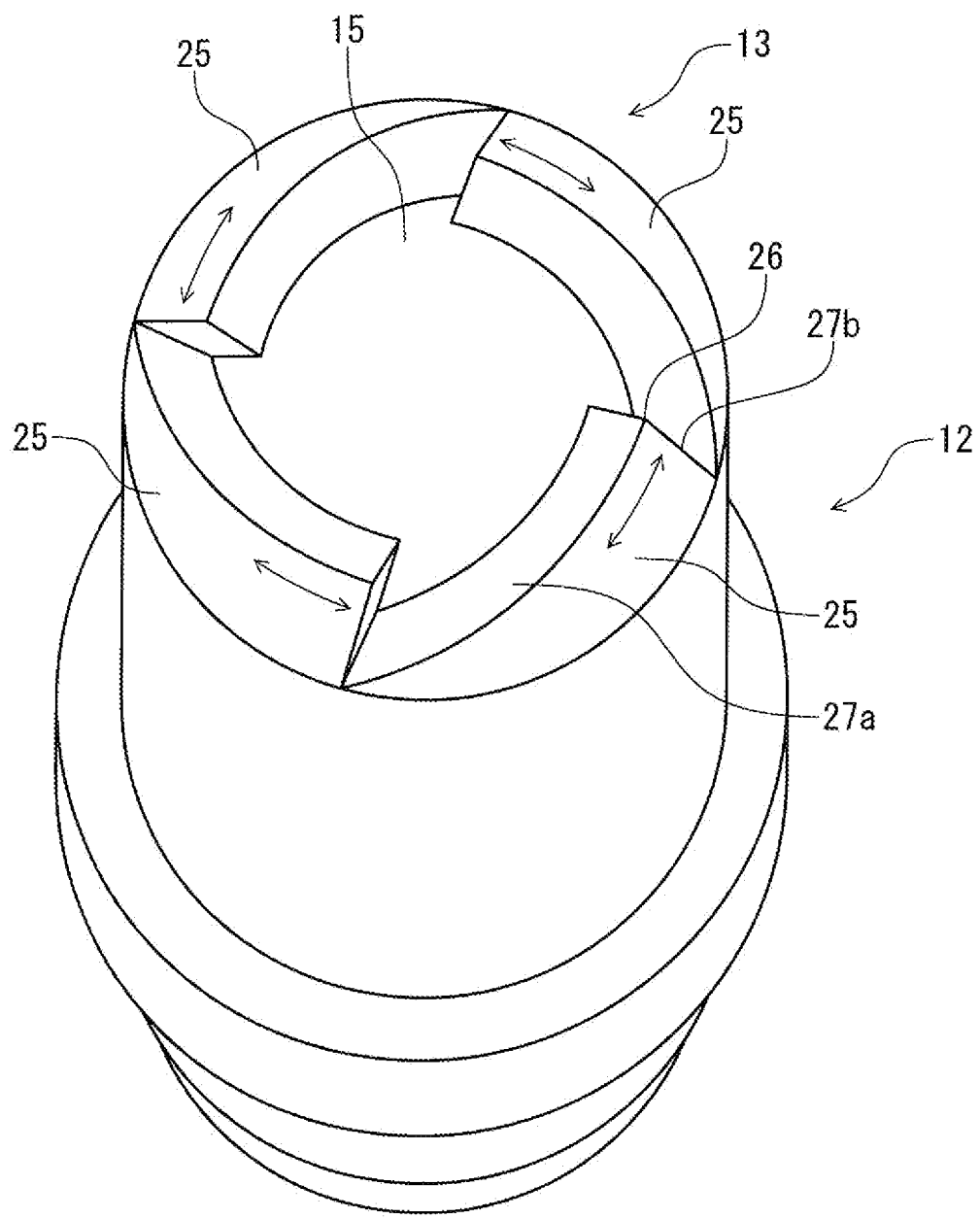
FIG. 5 is a perspective view, as viewed obliquely from above, of the plunger which constitutes the contact probe shown in FIG. 1.

As shown in FIGS. 4A, 4B and FIG. 5, the top contacting member 13, which is provided at the tip of the plunger 12, includes a plurality of (in this exemplary embodiment, four) mountain-shaped sharp portions 25. Each sharp portion 25 has ridges 27a and 27b formed on both sides of a peak 26. As shown in FIG. 4B, each sharp portion 25 is asymmetrical with respect to a straight line A, which is parallel with the axial line of the plunger 12, passing through the peak 26. As a result, the ridges 27a and 27b of each sharp portion 25 have different lengths. More specifically, the ridge 27b is shorter than the ridge 27a. As shown in FIGS. 1 to 5, the cylindrical plunger 12 is formed with a flange 22, which extends in a circumferential direction of the plunger 12 and projects outward.

Figure 6A:
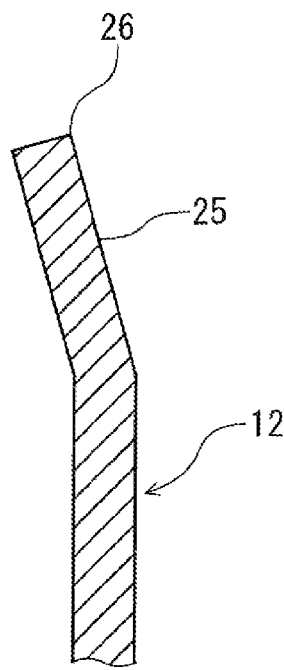
FIGS. 6A to 6C are cross-sectional views showing example shapes of each sharp portion of a top contacting member of the plunger.
Figure 6B:
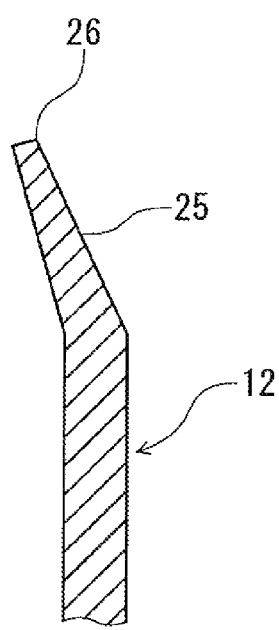
Figure 6C:
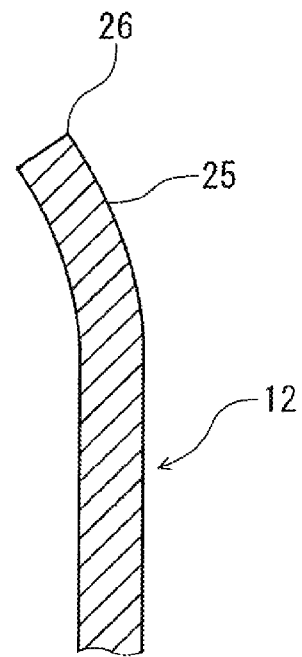

As shown in FIG. 6A, each sharp portion 25 of the top contacting member 13 is bent toward a center line of the plunger 12. As a result, a diameter of a circle passing through the peaks 26 of the respective sharp potions 25 is smaller than that of the through-hole 15 of the plunger 12, and is also smaller than an outer diameter of the coil spring 17. Therefore, the top end of the coil spring 17 is in contact with inner surfaces of the sharp portions 25 (see FIG. 2) and is thereby prevented from losing contact with the top end of the plunger 12. As shown in FIG. 6B, each sharp portion 25 may become thinner gradually toward the peak 26. As shown in FIG. 6C, each sharp portion 25 may be gradually curved inward. As shown in FIG. 2, a narrow portion 29 whose diameter decreases gradually downward may be formed at the bottom of the plunger 12.

As shown in FIGS. 2 and 3, the sub-plunger 16 has a cylindrical rod portion 31 and a flange 32, which is formed at a middle position, in the axial direction, of the rod portion 31. The bottom end portion of the rod portion 31 is the bottom contacting member 14. An outer diameter of the rod portion 31 is slightly smaller than an inner diameter of the coil spring 17, and an outer diameter of the flange 32 is larger than the inner diameter of the coil spring 17 and is slightly smaller than the diameter of the through-hole 15 of the plunger 12. An upper portion of the rod portion 31 of the sub-plunger 16 is inserted in the coil spring 17, and the flange 32 is in contact with the coil spring 17. The sub-plunger 16 is housed in the through-hole 15 of the plunger 12, and is urged by the urging force of the coil spring 17 and thereby engages with the narrow portion 29 of the plunger 12 so as not to lose contact with the plunger 12 at its bottom end.

In the contact probe 11 having the above configuration, the coil spring 17 is housed in the through-hole 15 of the plunger 12 in a compressed state. As a result, the plunger 12 and the sub-plunger 16 are urged by the coil spring 17 in opposite directions away from each other. The top contacting member 13 and the bottom contacting member 14 are thus urged by the coil spring 17 in opposite directions away from each other.

Figure 7:
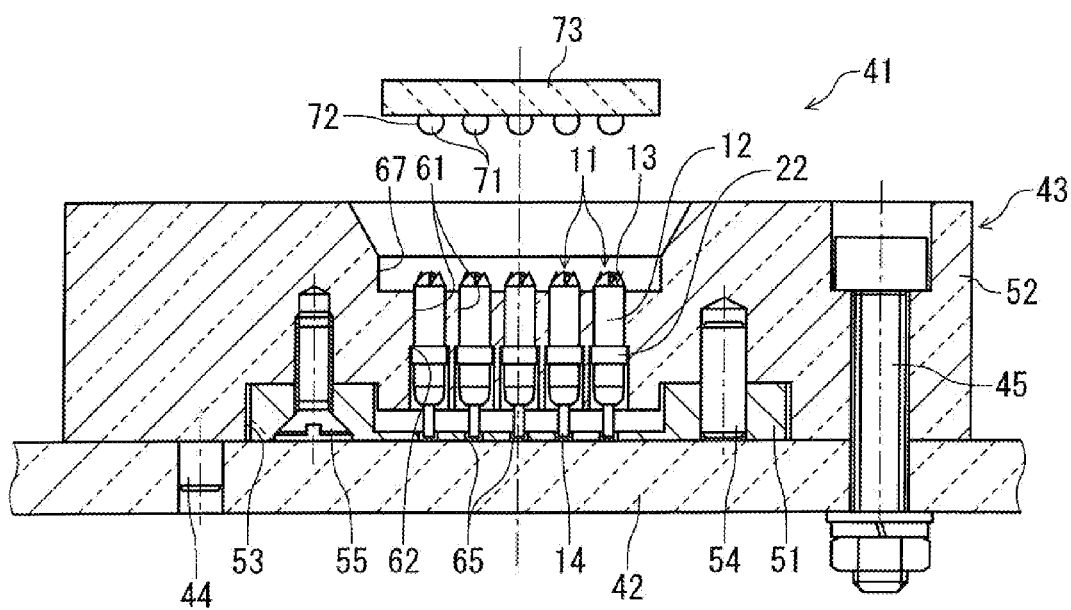
FIG. 7 is a cross-sectional view showing an example configuration of a semiconductor device socket according to the first exemplary embodiment.

Next, a semiconductor device socket having plural contact probes 11 will be described. As shown in FIG. 7, the semiconductor device socket 41 has a probe housing block 43, is positioned with respect to a testing board 42 by a positioning pin 44, and is fixed to the testing board 42 with a fastening bolt 45.

The probe housing block 43 includes a contacting member arrangement board 51 and a socket board 52 both of which are insulators. The socket board 52 is formed with an arrangement board housing recess 53 on the bottom surface side. The contacting member arrangement board 51 is fitted in the arrangement board housing recess 53, positioned with respect to the socket board 52 by a positioning pin 54, and fixed (screwed) to the socket board 52 with a screw 55.

The socket board 52 is formed with plural probe housing holes 61 which house respective contact probes 11, which are inserted from below the probe housing holes 61. Each probe housing hole 61 is formed with a step 62 at a middle position in an axial direction thereof. The portion, above the step 62, of each probe housing hole 61 is smaller in diameter than the flange 22 and the position, below the step 62, of each probe housing hole 61 is slightly larger in diameter than the flange 22. As a result, when a contact probe 11 is inserted into a probe housing hole 61 from below, the flange 22 of the plunger 12 is engaged with the step 62 and the contact probe 11 is thereby prevented from moving upward.

The contacting member arrangement board 51, which is fixed to the socket board 52, is formed with plural contacting member holding holes 65 so as to correspond to the respective probe housing holes 61. The bottom contacting members 14 of the contact probes 11 housed in the probe housing holes 61 are inserted in the contacting member holding holes 65, respectively. As a result, the bottom contacting members 14 of the contact probes 11 are held by the respective contacting member holding holes 65 and thereby set at given positions of the testing board 42. The testing board 42 is provided with electrodes (not shown) at the positions where the bottom contacting members 14 of the contact probes 11 are located, whereby each of the electrodes is in electrical contact with a respective one of the bottom contacting members 14 of the contact probes 11.

The socket board 52 is formed with a socket recess 67 on the top surface side thereof. A semiconductor device 73, which has a bottom surface formed with plural electrodes 72 having solder balls 71, can be inserted into the socket recess 67 from above.

Figure 8:
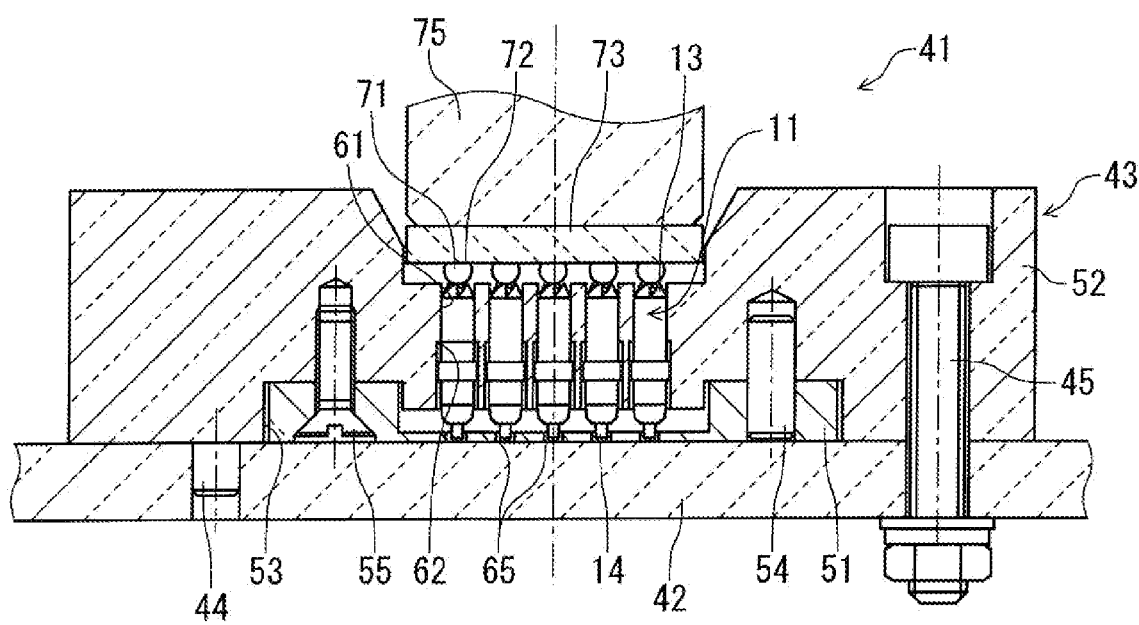
FIG. 8 is a cross-sectional view showing an operation of the semiconductor device socket shown in FIG. 7.
Figure 9A:
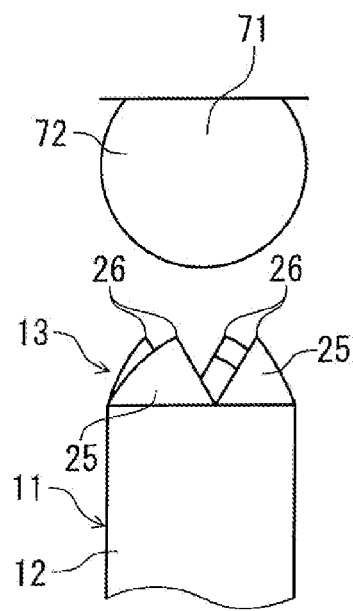
FIGS. 9A to 9C are side views showing how a solder ball comes into contact with a top contacting member.
Figure 9B:
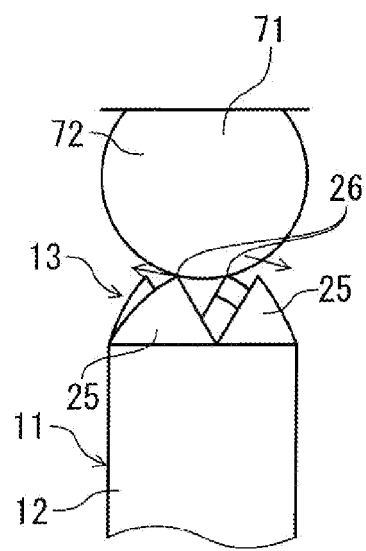
Figure 9C:
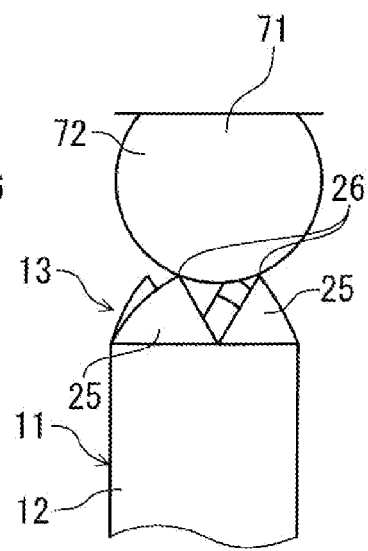

When testing the semiconductor device 73 using the above-configured semiconductor device socket 41, the semiconductor device 73 is inserted into the socket recess 67 of the socket board 52. In this state, as shown in FIG. 8, the semiconductor device 73 is pressed downward by a pressing member 75. As a result, the semiconductor device 73 is pressed down in the socket recess 67, and, as shown in FIG. 9A, the solder ball 71 of each electrode 72 approaches the top contacting member 13 of the corresponding contact probe 11. Then, as shown in FIG. 9B, each solder ball 71 is pressed against and comes into contact with the corresponding top contacting member 13.

When the solder ball 71 is pressed against the top contacting member 13 of the contact probe 11, axial compressing force acts on the contact probe 11, whereby the coil spring 17 is compressed. As a result, the elastic force of the coil spring 17 is increased and the elastic force of the coil spring 17 presses the bottom contacting member 14 of the contact probe 11 against the corresponding electrode of the testing board 42.

Each sharp portion 25 of the top contacting member 13 of each contact probe 11 is formed in a mountain-shape and, as shown in FIGS. 1 and 4B, is asymmetrical with respect to the straight line A that passes through the peak 26 and extends parallel with the axial line of the plunger 12. Therefore, the peak portion of each sharp portion 25 slightly digs into the solder ball 71, which is being pressed against the top contacting member 13. As a result, the solder ball 71 is displaced in a direction that crosses the axial direction along each longer ridge 27a. Thus, as shown in FIG. 9B, the solder ball 71 and each sharp portion 25 slide slightly with respect to each other when being pressed against each other. Even if the surface of the solder ball 71 or each sharp portion 25 is covered with an oxide coating or stuck with foreign substances, the oxide coating or the foreign substances are removed as the solder ball 71 and each sharp portion 25 slide with respect to each other. As a result, an active solder portion of the solder ball 71 and a part (indicated by an arrow in FIG. 5) of the longer ridge 27a of each sharp portion 25 of the top contacting member 13 are brought into line contact with each other, whereby electrical continuity is reliably and stably established between them.

Figure 10:
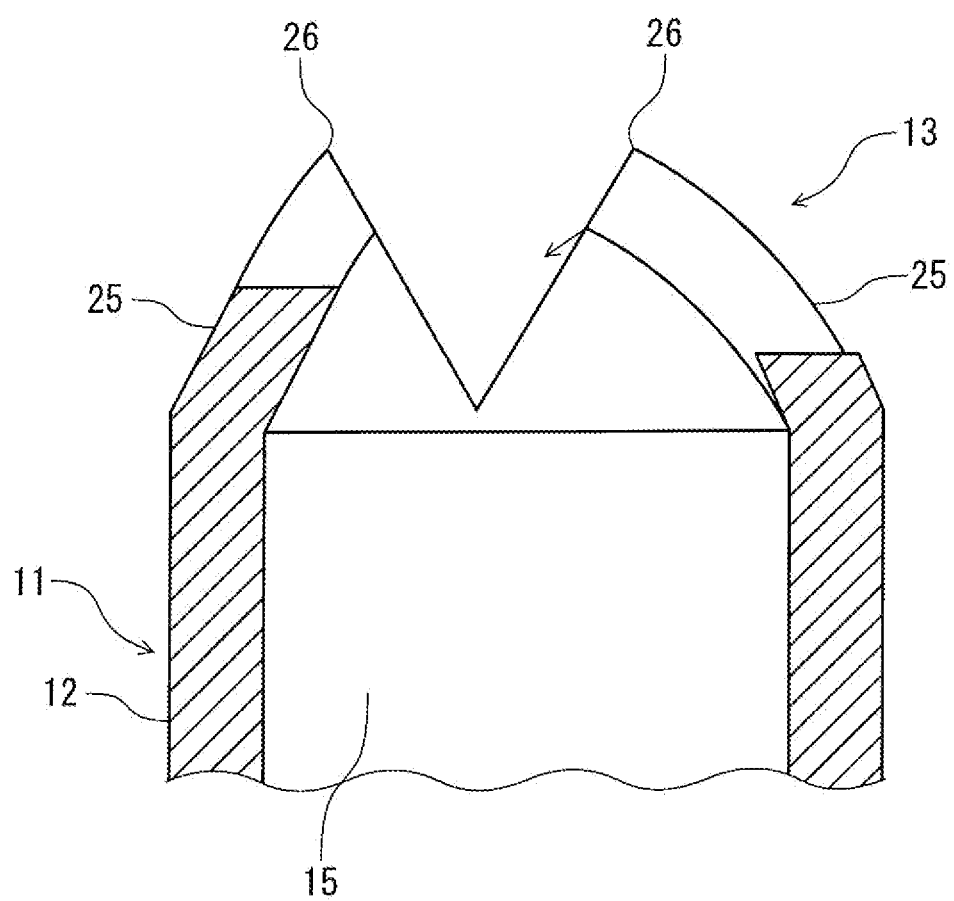
FIG. 10 is a cross-sectional view showing the top contacting member of the plunger and showing how each sharp portion of the top contacting member is bent.

Since each sharp portion 25 is bent toward the center line of the plunger 12, as shown in FIG. 10, each sharp portion 25 is elastically deformed inward (indicated by an arrow in FIG. 10) due to being pressed by the solder ball 71. If the solder ball 71 and the contact probe 11 are deviated from each other, a sharp portion 25 that receives a heavier load than the other sharp portions 25 is elastically deformed inward more than the other sharp portions 25, whereby differences of the distances between the solder ball 71 and the sharp portions 25 are absorbed and the sharp portions 25 come to contact the solder ball 71 uniformly. In this manner, electrical continuity is established reliably between the electrodes 72 of the semiconductor device 73 and the electrodes of the testing board 42 via the contact probes 11, which enables a test of the semiconductor device 73.

As described above, in the contact probe 11 according to the exemplary embodiment, each sharp portion 25 of the top contacting member 13 is formed in a mountain-shape so as to be asymmetrical with respect to the straight line A that passes through the peak 26 and extends along the axial line of the plunger 12. This causes a solder ball 71 to slide along the longer ridge 27a of each sharp portion 25 and to be brought into line contact with the longer ridge 27a. As a result, electrical continuity is established reliably and stably between an active solder portion of the solder ball 71 and each sharp portion 25 of the top contacting member 13.

Each sharp portion 25 is bent toward the center line of the plunger 12 and hence is apt to be deformed toward the center side. Therefore, even if a solder ball 71 and a contact probe 11 are deviated from each other, the sharp portions 25 are elastically deformed, whereby differences of the distances between the solder ball 71 and the sharp portions 25 are absorbed and the sharp portions 25 come to contact the solder ball 71 uniformly.

In particular, where each sharp portion 25 is shaped so as to decrease in thickness toward the peak 26, each sharp portion 25 is more apt to be deformed elastically, which can allow the sharp portions 25 to contact a solder ball 71 with a higher level of uniformity.

The semiconductor device socket 41 including the contact probes 11 can reliably establish electrical continuity between the electrodes 72 of the semiconductor device 73 and the electrodes of the testing board 42 via the contact probes 11, and hence can maintain high reliability of a number of tests carried out on semiconductor devices 73.

The contact probe 11 according to the exemplary embodiment can be manufactured relatively easily by forming the plunger 12 by cutting or press working and attaching the coil spring 17 and the sub-plunger 16 to the plunger 12. Next, an exemplary manufacturing method of the contact probe 11 will be outlined below.

(1) Regarding a Formation of the Plunger 12

The plunger 12 may be formed using cutting. Specifically, as shown in FIG. 11a, a cylindrical body 81, which will become the plunger 12, is formed by first using a lathe or the like to form a through-hole 15, which the coil spring 17 can be inserted into, at one end of a metal rod made of a copper or iron-based material. The thickness of the cylindrical body 81 is set to be such a value that the resulting plunger 12 will be strong enough to endure the load that will act on the plunger 12 during testing of a semiconductor device 73. As shown in FIG. 11B, the top contacting member 13 of the plunger 12 is then formed by cutting the tip portion of the cylindrical body 81 into a tapered shape. As shown in FIG. 11C, a V-shaped cut 82 is then formed by cutting the tapered tip portion of the cylindrical body 81.

As shown in FIG. 11D, V-shaped cuts 82 are then formed at plural positions while the cylindrical body 81 is rotated for form the plurality of mountain-shaped sharp portions 25 of the plunger. Each sharp portion 25 is formed so as to be asymmetrical with respect to the straight line A (see FIGS. 1 and 4B) that passes through the peak 26 and that extends along the axial line of the cylindrical body 81.

Then, as shown in FIG. 11E, each sharp portion 25 is bent toward the center line of the cylindrical body 81. Then, the rod is cut to form the cylindrical body 81 and the cylindrical body 81 is subjected to various kinds of surface treatment such as nickel plating or gold plating depending on the material to complete the formation of the plunger 12.

The plunger 12 may also be formed using press working. Specifically, as shown in FIG. 12A, first a metal sheet 85 made of a copper or iron-based material is punched using metal dies and a pressing machine or the like. The thickness of the metal sheet 85 is set to be such a value that the resulting plunger 12 will be strong enough to endure the load that will act on the plunger 12 during testing of a semiconductor device 73. By such press working, plural V-shaped cuts 86 are formed in one side end portion of the metal sheet 85 to form the mountain-shaped sharp potions 25. Each sharp portion 25 is shaped so as to be asymmetrical with respect to the vertical line (as viewed in FIG. 12A) passing through its peak.

Then, as shown in FIG. 12B, a cylindrical body having a through-hole 15 into which the coil spring 17 can be inserted is formed by bending the metal sheet 85. Then, as shown in FIG. 12C, each sharp portion 25 is bent toward the center line of the cylindrical body for form the tip portion. Then, the cylindrical body is subjected to various kinds of surface treatment such as nickel plating or gold plating depending on the material to complete the formation of the plunger 12.

(2) Regarding a Bending Process of the Sharp Portion 25

As shown in FIG. 13A, a forming jig 91 is used to bend the sharp portions 25 toward the center line of the plunger 12 to form the top contacting member 13 of the plunger 12. The forming jig 91 is formed with a forming recess 92 which has a tapered wall 93 which gradually narrows toward the inside end thereof.

Then, as shown in FIG. 13B, the top portion of the plunger 12 is pressed into the forming recess 92 of the forming jig 91, whereby the tip sharp potions 25 of the plunger 12 are bent so as to conform to the tapered wall 93 of the forming recess 92. As a result, the plunger 12 having the sharp portions 25 that are bent toward the center line of the plunger 12 is obtained as shown in FIG. 13C.

(3) Regarding an Attaching Process

Figure 14A:
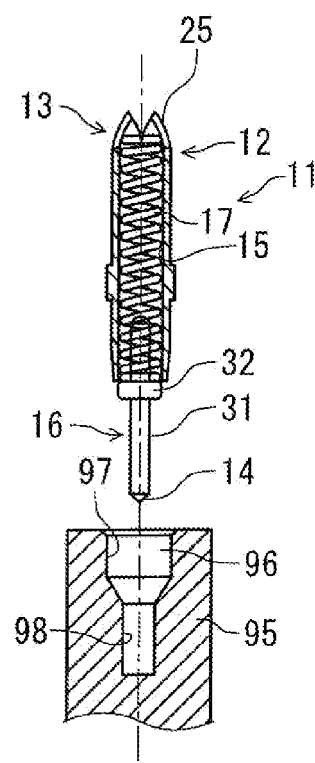
FIGS. 14A to 14C are cross-sectional views showing how a coil spring and a sub-plunger are attached to the plunger.

An assembling jig 95 shown in FIG. 14A is used to attach the coil spring 17 and the sub-plunger 16 to the thus-manufactured plunger 12. The assembling jig 95 is formed with a crimping recess 96 which has a crimping wall 97 which narrows gradually toward the bottom end thereof. Further, a holding recess 98 is formed at a bottom of the assembling jig 95.

Figure 14B:
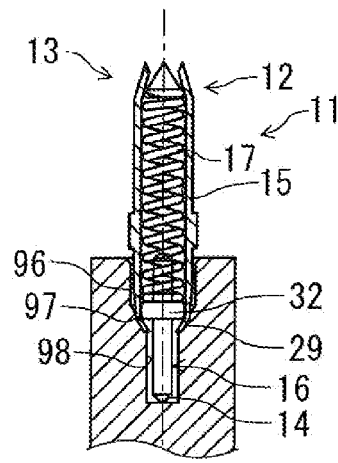

To attach the coil spring 17 and the sub-plunger 16 to the plunger 12 using the assembling jig 95, first, the coil spring 17 and the sub-plunger 16 are inserted in order into the through-hole 15 of the plunger 12 from below. Then, as shown in FIG. 14B, the sub-plunger 16 is pressed into the crimping recess 96 of the assembling jig 95, whereby the bottom contacting member 14 of the sub-plunger 16 comes into contact with the bottom surface of the holding recess 98 and is thereby prevented from moving downward further. As a result, the sub-plunger 16 goes into the through-hole 15 of the plunger 12 while compressing the coil spring 17.

Figure 14C:
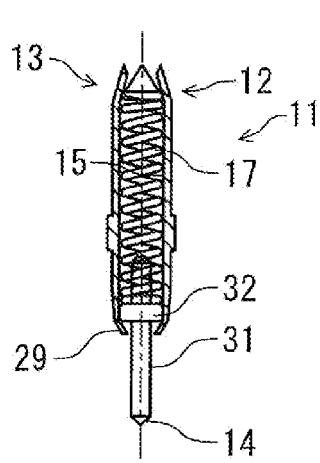

When the sub-plunger 16 is pressed further into the crimping recess 96, a bottom portion of the plunger 12 is bent so as to conform to the crimping wall 97 of the crimping recess 96. As a result, as shown in FIG. 14C, the bottom portion of the plunger 12 is caulked into a narrow portion 29. The contact probe 11 in which the coil spring 17 and the sub-plunger 16 are attached to the plunger 12 is thus completed.

As described above, the contact probe 11 can be manufactured easily by either cutting or press working. Therefore, the contact probe 11 can be manufactured efficiently by selecting an optimum working method for a production situation such as small-quantity production or mass production. Furthermore, cost increase etc. due to production of unnecessary dies can be prevented.

Figure 15A:
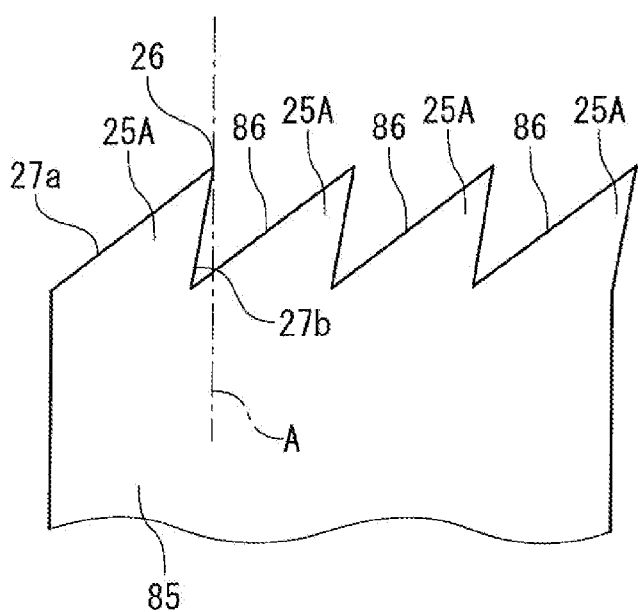
Figure 15B:
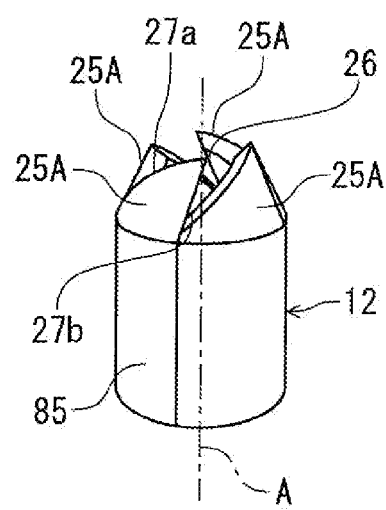

The shape of each sharp portion 25 of the contact probe 11 is not limited to the shapes described in the first exemplary embodiment. FIGS. 15A and 15B show sharp portions 25A having a different shape. In each mountain-shaped sharp portion 25A, ridges 27a and 27b are located on the same single side with respect to a straight line A that passes through a peak 26 and extends along the axial line of the plunger 12. With a contact probe 11 having a top contacting member 13A which includes the sharp portion 25A having the above-described shape, the sharp portion 25A can be elastically deformed more easily by a load that acts on the sharp portion 25A in testing a semiconductor device 73. Therefore, the contact probe 11 can contact a solder ball 71 with an even higher level of uniformity.

To manufacture a plunger 12 having the sharp portions 25A, first, as shown in FIG. 15A, a plurality of V-shaped cuts 86 are formed by punching in one side end portion of a metal sheet 85 to form mountain-shaped sharp potions 25A. Each sharp portion 25A is shaped so as to be asymmetrical with respect to the straight line A passing through its peak 26 and so that the ridges 27a and 27b are located on the same single side of the straight line A. Then, as shown in FIG. 15B, a cylindrical body having a through-hole 15 into which the coil spring 17 can be inserted is formed by bending the metal sheet 85.

Figure 16:
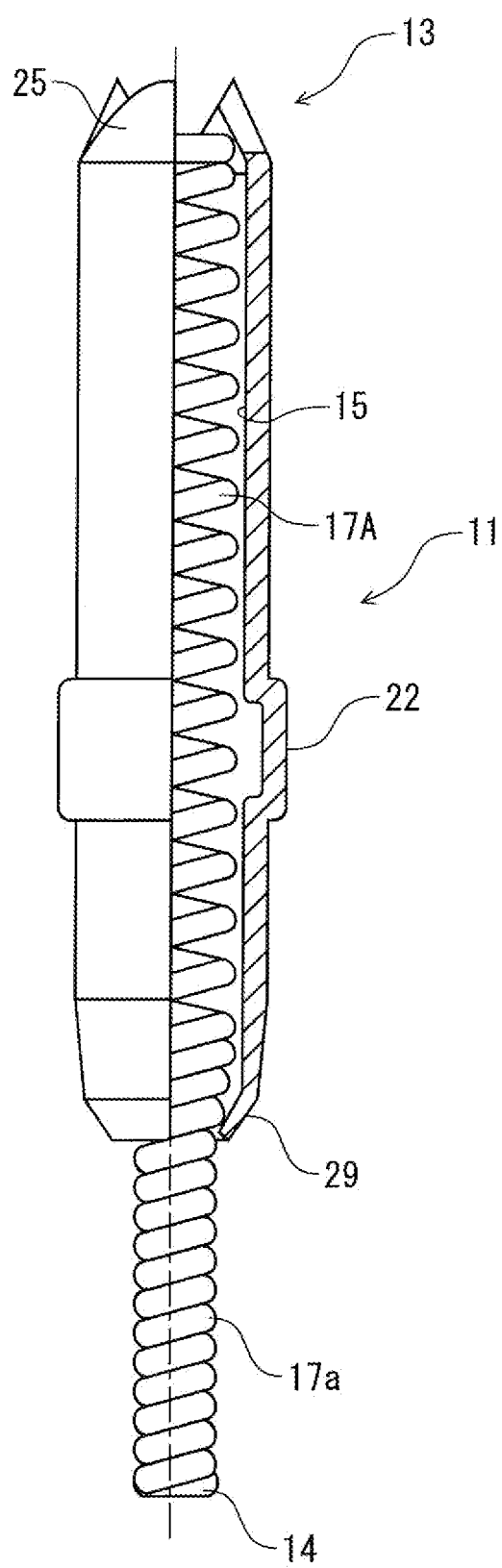
FIG. 16 is a side view in which a half part of the contact probe further according to another exemplary embodiment is shown in cross-section.

Although the contact probe 11 according to the first exemplary embodiment is provided with the sub-plunger 16 having the bottom contacting member 14, a contact probe not having the sub-plunger 16 can also be provided. FIG. 16 shows a contact probe 11A in which a bottom end portion of a coil spring 17A serves as a bottom contacting member 14 (the sub-plunger 16 is not used).

More specifically, at a bottom portion of the coil spring 17A, a rod-like portion 17a is formed such that the winding diameter is reduced and one-pitch portions are in close contact with each other in the axial direction. Further, the rod-like portion 17a projects through the bottom opening of the plunger 12. In the contact probe 11A, a bottom end portion of the rod-like portion 17a serves as the bottom contacting member 14. The thus-configured contact probe 11A enables cost reduction because the number of components is reduced.

The number of sharp portions 25 constituting the top contacting member 13 of the plunger 12 is not limited to four; satisfactory results may be obtained as long as a plurality of sharp portions 25 are provided. As examples of top contacting members each having less-than-four sharp portions 25, FIG. 17A shows a top contacting member 13B in which two sharp portions 25 are opposed to each other, and FIG. 17B shows a top contacting member 13C in which three sharp portions 25 are arranged at equal intervals in a circumferential direction of the plunger 12.

As examples of top contacting members each having more-than-four sharp portions 25, FIG. 17C shows a top contacting member 13D in which five sharp portions 25 are arranged at equal intervals in the circumferential direction of the plunger 12, FIG. 17D shows a top contacting member 13E in which six sharp portions 25 are arranged at equal intervals in the circumferential direction, and FIG. 17E shows a top contacting member 13F in which eight sharp portions 25 are arranged at equal intervals in the circumferential direction.

While the aspects of the present inventive concept have been shown and described with reference to certain exemplary embodiments thereof, it will be understood by those skilled in the art that various changes in form and details may be made therein without departing from the spirit and scope of the invention as defined by the attached claims.

What is claimed is:
1. A contact probe comprising:
   a plunger;
   a top contacting member provided at a tip end of the plunger and configured to be brought into contact with an electrode of a semiconductor device;

a bottom contacting member which is configured to be brought into contact with an electrode of a testing board; and an elastic member for urging the top contacting member and the bottom contacting member in opposite directions away from each other, wherein the plunger is a cylindrical shape and includes a through-hole which penetrates through the plunger in an axial direction thereof, wherein the top contacting member includes a plurality of mountain-shaped sharp portions each including a peak formed in a direction projecting from the tip end of the plunger and a pair of ridges extending in an opposite direction from the projecting direction of the peak, wherein each of the sharp portions is asymmetrical with respect to a straight line that passes through the peak and extends along an axial direction of the plunger, each of the ridges of the pair of ridges is located on a same lateral side or opposite sides of the straight line that passes through .the peak and which extends along the axial direction of the plunger, wherein each of the sharp portions is bent toward a center line of the plunger, wherein one of the pair of ridges is longer than the other, and wherein, when the peak is in contact with the electrode of the semiconductor device, each of the sharp portions is elastically deformed toward the center line of the plunger and the electrode of the semiconductor device and the longer ridge of each of the sharp portions are in contact and slide against each other.

2. The contact probe according to claim 1, wherein each of the sharp portions decreases gradually in thickness toward the peak of the respective sharp portions.

3. The contact probe according to claim 2, wherein a pair of ridges of each of the mountain-shaped sharp portions are located on the same side of the straight line passing through a peak of the sharp portion.

4. The contact probe according to claim 3, further comprising:

a sub-plunger including the bottom contacting member, wherein the plunger and the sub-plunger are urged by the elastic member in opposite directions away from each other.

5. The contact probe according to claim 2, further comprising:

a sub-plunger including the bottom contacting member, wherein the plunger and the sub-plunger are urged by the elastic member in opposite directions away from each other.

6. The contact probe according to claim 1, wherein a pair of ridges of each of the mountain-shaped sharp portions are located on the same side of the straight line passing through a peak of the sharp portion.

7. The contact probe according to claim 6, further comprising: a sub-plunger including the bottom contacting member, wherein the plunger and the sub-plunger are urged by the elastic member in opposite directions away from each other.

8. The contact probe according to claim 1, further comprising:

a sub-plunger including the bottom contacting member, wherein the plunger and the sub-plunger are urged by the elastic member in opposite directions away from each other.

9. A semiconductor device socket to receive the semiconductor device comprising:

a contact probe according to claim 1, wherein electrical continuity between the electrode of the semiconductor device and the electrode of the testing board is established via the contact probe.

* * * * *